(12) United States Patent
Procopio et al.

(10) Patent No.: US 10,135,365 B2
(45) Date of Patent: Nov. 20, 2018

(54) CANTILEVER PIEZOELECTRIC TRANSDUCER

(71) Applicant: STMicroelectronics S.R.L., Agrate Brianza (IT)

(72) Inventors: Francesco Procopio, Sedriano (IT); Attilio Frangi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 290 days.

(21) Appl. No.: 14/980,762

(22) Filed: Dec. 28, 2015

(65) Prior Publication Data
US 2016/0373031 A1 Dec. 22, 2016

(30) Foreign Application Priority Data
Jun. 18, 2015 (IT) .................... 102015000025255

(51) Int. Cl.
*H02N 2/18* (2006.01)
*H01L 41/113* (2006.01)

(52) U.S. Cl.
CPC ......... *H02N 2/186* (2013.01); *H01L 41/1136* (2013.01); *H02N 2/181* (2013.01)

(58) Field of Classification Search
CPC ...... H02N 2/186; H02N 2/18; H01L 41/1136; H01L 41/113; H01L 41/1134
USPC ................................................ 310/319, 339
See application file for complete search history.

(56) References Cited

U.S. PATENT DOCUMENTS

| 2007/0024715 | A1 | 2/2007 | Hirasawa et al. |
| 2008/0174273 | A1* | 7/2008 | Priya ............. H01L 41/1136 320/114 |
| 2010/0270889 | A1* | 10/2010 | Xu .................... G01P 15/09 310/329 |
| 2011/0101827 | A1 | 5/2011 | Yoon et al. |
| 2013/0062999 | A1* | 3/2013 | Muker-Uz-Zaman ............. H02N 2/186 310/339 |
| 2013/0293069 | A1* | 11/2013 | Sakaguchi ........... H02N 2/186 310/348 |
| 2015/0035409 | A1* | 2/2015 | Procopio ............ H02N 2/181 310/319 |
| 2015/0295520 | A1* | 10/2015 | Hasegawa ........ H01L 41/1136 310/323.01 |

OTHER PUBLICATIONS

Kulah et al., "An Electromagnetic Micro Power Generator for Low-Frequency Environmental Vibrations," *Proceedings of the IEEE International Conference on Micro Electro Mechanical Systems (MEMS)*, Jan. 2004, pp. 237-240.
(Continued)

*Primary Examiner* — Bryan Gordon
(74) *Attorney, Agent, or Firm* — Seed IP Law Group LLP

(57) ABSTRACT

A piezoelectric transducer includes: an anchorage; a beam of semiconductor material, extending in cantilever fashion from the anchorage in a main direction parallel to a first axis and having a face parallel to a first plane defined by the first axis and by a second axis perpendicular to the first axis; and a piezoelectric layer on the face of the beam. A cross-section of the beam perpendicular to the first axis is asymmetrical and is shaped so that the beam presents deformations out of the first plane in response to forces applied to the anchorage and oriented according to the first axis.

20 Claims, 7 Drawing Sheets

(56) References Cited

OTHER PUBLICATIONS

Najafi et al., "Microsystems for Energy Harvesting," 16$^{th}$ International Solid-State Sensors, Actuators and Microsystems Conference, Beijing, China, Jun. 5-9, 2011, pp. 1845-1850.

Roundy, "Energy Scavenging for Wireless Sensor Nodes with a Focus on Vibration to Electricity Conversion," Dissertation, The University of California, Berkeley, Spring 2003, 297 pages.

Shahosseini et al., "Electromagnetic Generator Optimization for Non-Resonant Energy Harvester," IEEE Sensors, 2014, 4 pages.

Yamada, "Enhancing efficiency of piezoelectric element attached to beam using extended spacers," *Journal of Sound and Vibration 341*:31-52, 2015.

\* cited by examiner

CANTILEVER PIEZOELECTRIC TRANSDUCER

BACKGROUND

Technical Field

The present disclosure relates to an asymmetrical cantilever piezoelectric transducer.

Description of the Related Art

The present disclosure is particularly suited for providing piezoelectric microtransducers that may be used in miniaturized energy-harvesting systems suitable for supplying, amongst other things, electronic components and/or devices such as low-consumption sensors and actuators, frequently used in portable electronic devices such as cellphones, tablets, portable computers (laptops), video cameras, photographic cameras, consoles for videogames, and so forth.

As is known, systems for harvesting energy (known as "energy-harvesting systems" or "energy-scavenging systems") from environmental energy sources have aroused and continue to arouse considerable interest in a wide range of fields of technology. Typically, energy-harvesting systems are designed to harvest and store energy generated by mechanical sources and to transfer it to a generic load of an electrical type. In this way, the electrical load does not require batteries or other power-supply systems that are frequently cumbersome and present a poor resistance to mechanical stresses and entail maintenance costs for interventions of replacement. Further, systems for harvesting environmental energy cover a considerable interest for devices that are in any case provided with battery-supply systems, which, however, present a rather limited autonomy. This is the case, for example, of many portable electronic devices that are becoming of increasingly common use, such as cellphones, tablets, portable computers (laptops), video cameras, photographic cameras, consoles for videogames, etc. Systems for harvesting environmental energy may be used for supplying incorporated components or devices in order to reduce the energy absorbed from the battery and consequently to increase autonomy.

Environmental energy may be harvested from various available sources and converted into electrical energy by purposely provided transducers. For example, available energy sources may be mechanical or acoustic vibrations or, more in general, forces or pressures, chemical energy sources, electromagnetic fields, environmental light, thermal energy sources, etc.

For harvesting and conversion piezoelectric transducers may, amongst other things, be used.

A common type of piezoelectric transducer uses a microstructure comprising a supporting body connected to which are cantilever elements, defined by plane plates constrained to the supporting body at one end and having regions of piezoelectric material at least on a portion of a face. The free ends of the cantilever elements, to which additional masses may be connected, oscillate elastically in response to movements of the supporting body or to vibrations transmitted thereto. As a result of the movements of bending and extension during the oscillations, the piezoelectric material produces a charge that may be harvested and stored in a storage element. Piezoelectric transducers of this kind are suitable for efficiently converting mechanical actions in a direction perpendicular to the faces of the cantilever elements (in the resting condition) in so-called "out of plane" directions. In these directions, in fact, it is possible to obtain maximum bending of the cantilever elements.

However, the response of transducers of this type is practically zero in regard to mechanical actions parallel to the faces of the cantilever elements in so-called "in plane" directions. Disregarding the possibility of using transducers or cantilever elements arranged in different planes (in any case at the expense of a greater occupation of space), the conversion of mechanical energy into electrical energy carried out by the single cantilever element is efficient exclusively in one direction and thus relatively limited.

BRIEF SUMMARY

One aim of the present disclosure is to provide a piezoelectric transducer that will enable the limitations described above to be overcome or at least attenuated.

According to the present disclosure a piezoelectric transducer is provided as defined in claim 1.

BRIEF DESCRIPTION OF THE SEVERAL VIEWS OF THE DRAWINGS

For a better understanding of the present disclosure, some embodiments thereof will now be described, purely by way of non-limiting example and with reference to the attached drawings, wherein.

DETAILED DESCRIPTION

Figure 1:
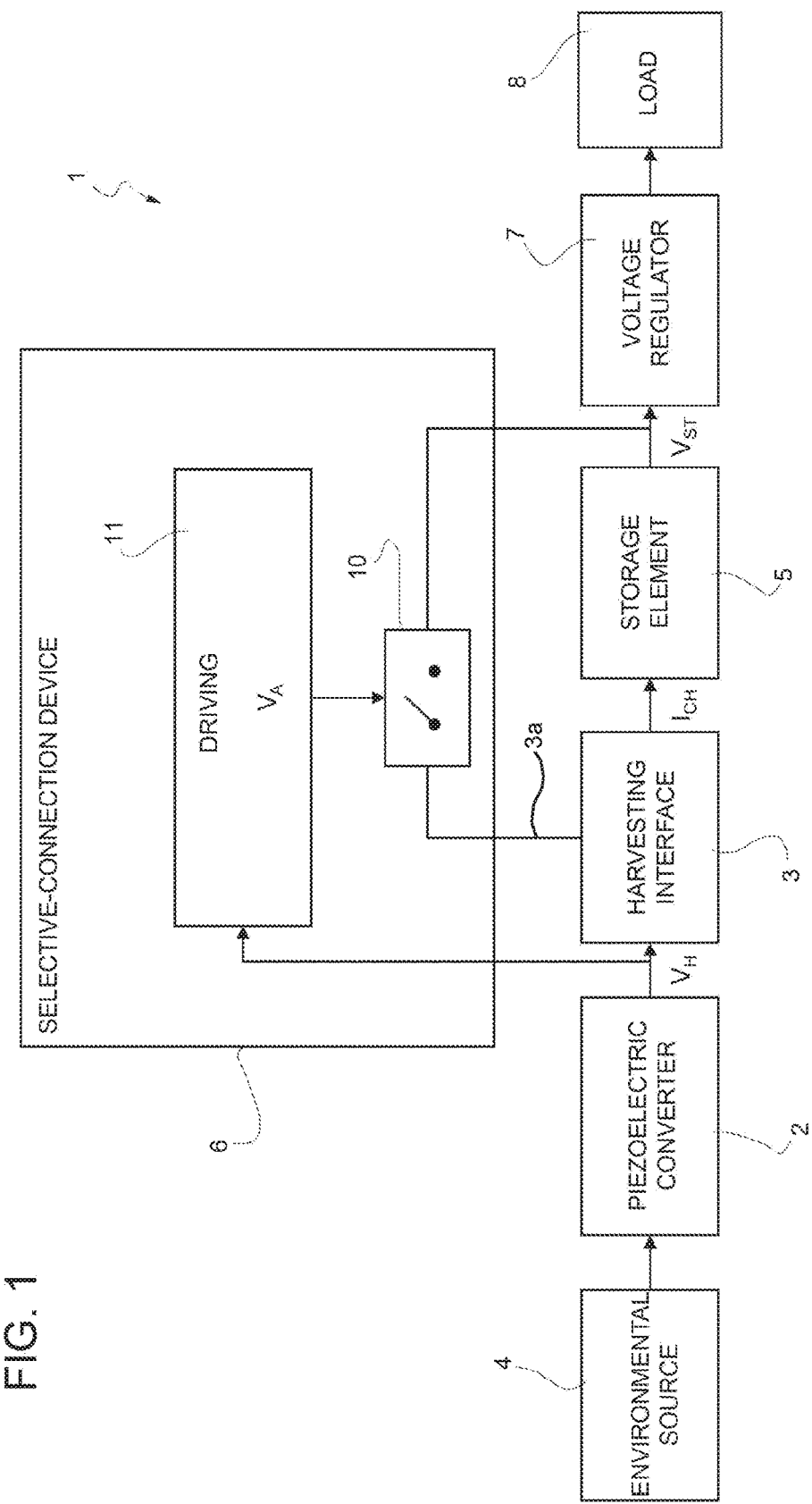
FIG. 1 is a simplified block diagram of an energy-harvesting system.

With reference to FIG. 1, an energy-harvesting system is designated as a whole by the reference number 1. The energy-harvesting system 1 is particularly, but not exclusively, suited to being used for supplying electronic components and/or devices such as low-consumption sensors and actuators, which are of increasingly frequent use in portable electronic devices such as cellphones, tablets, portable computers (laptops), video cameras, photographic cameras, consoles for videogames, etc.

Electronic components and devices supplied by the energy-harvesting system 1 may be rendered entirely or partially self-sufficient in order to reduce or eliminate absorption of energy from the main supply system (normally a battery), which thus has a greater autonomy, to the advantage of users.

In addition, in some applications, the energy-harvesting system 1 may be used either as a main supply source and as an auxiliary supply source for the electronic components and/or devices indicated above. In this case, the energy-harvesting system 1 may be arranged alongside a conventional power-supply system, for example of the battery type, and enter into operation when the main power-supply system has run down or presents malfunctioning.

The energy-harvesting system 1 comprises a piezoelectric converter 2, a harvesting interface 3, a storage element 5, a selective-connection device 6 and a voltage regulator 7. Further, an output of the voltage regulator 7 supplies an electrical load 8.

The piezoelectric converter 2 supplies a harvesting voltage $V_H$ in response to energy supplied by an environmental energy source 4 external to the harvesting system 1. The piezoelectric converter 2 supplies a harvesting voltage $V_H$ in response to mechanical vibrations transmitted from the external environment and will be described in greater detail in what follows.

The harvesting interface 3, when supplied by the storage element 5, receives the harvesting voltage $V_H$ from the piezoelectric converter 2 and supplies a charging current $I_{CH}$ to the storage element 5. The energy stored in the storage element 5 increases as a result of the charging current $I_{CH}$ and determines a storage voltage $V_{ST}$.

The selective-connection device 6 selectively connects and disconnects a supply input 3a of the harvesting interface 3 and the storage element 5 on the basis of the response of the piezoelectric converter 2. More precisely, when the harvesting voltage $V_H$ exceeds an activation threshold $V_A$, which represents a state in which the piezoelectric converter 2 is active and receives environmental energy from outside, the selective-connection device 6 connects the harvesting interface 3 to the storage element 5 so that the harvesting interface 3 receives the storage voltage $V_{ST}$ present on the storage element 5. The harvesting interface may thus use the harvesting voltage $V_H$ for charging the storage element 5. Instead, when the piezoelectric converter 2 does not receive environmental energy and the harvesting voltage $V_H$ is lower than the activation threshold $V_A$, the selective-connection device 6 disconnects the harvesting interface 3 from the storage element 5 so that the consumption of energy of the harvesting interface 3 ceases.

In one embodiment, in particular, the selective-connection device comprises a switch 10 and a driving stage 11, configured to control the switch 10 on the basis of the comparison between the harvesting voltage $V_H$ and the activation threshold $V_A$.

The voltage regulator 7 receives the storage voltage $V_{ST}$ and supplies a regulated supply voltage $V_{DD}$ to the electrical load 8 according to the requirement.

The selective supply device 6 enables consumption of the harvesting interface 3 to be substantially reduced to zero in the absence of activity of the piezoelectric converter 2 and thus prevents the energy accumulated on the storage element 5 from being dissipated without an effective need when the harvesting system 1 is not in a condition to receive energy from the environment.

Figure 2:
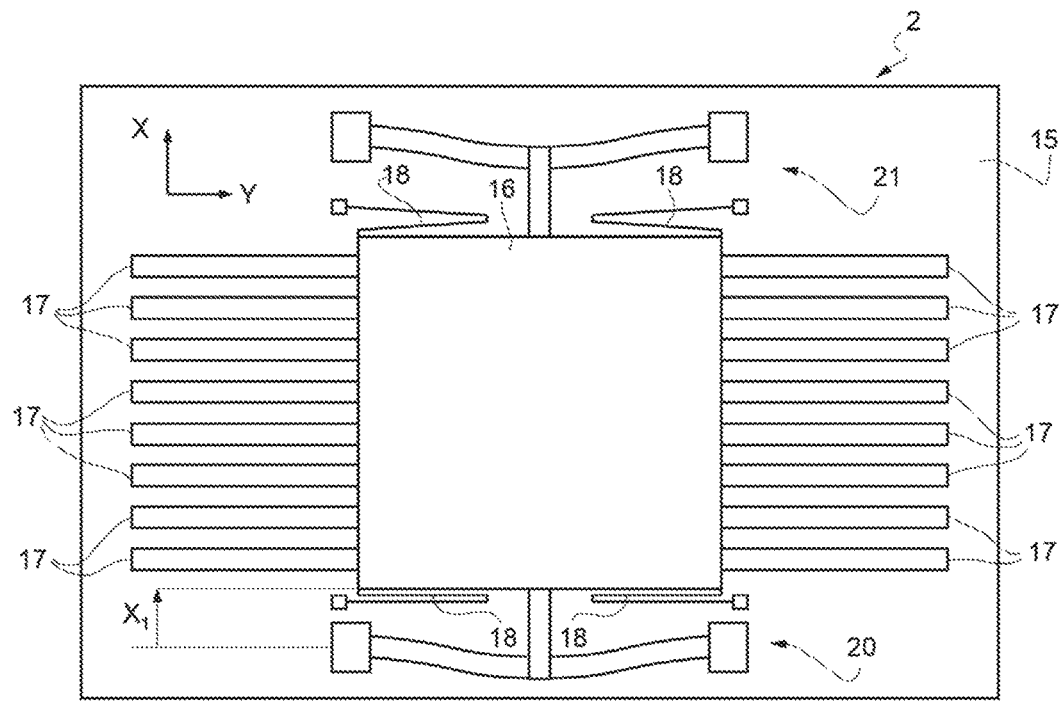
FIG. 2 is a simplified top plan view of a piezoelectric converter according to one embodiment of the present disclosure incorporated in the energy-harvesting system of FIG. 1, the piezoelectric transducer being illustrated in a first operative configuration.
Figure 3:
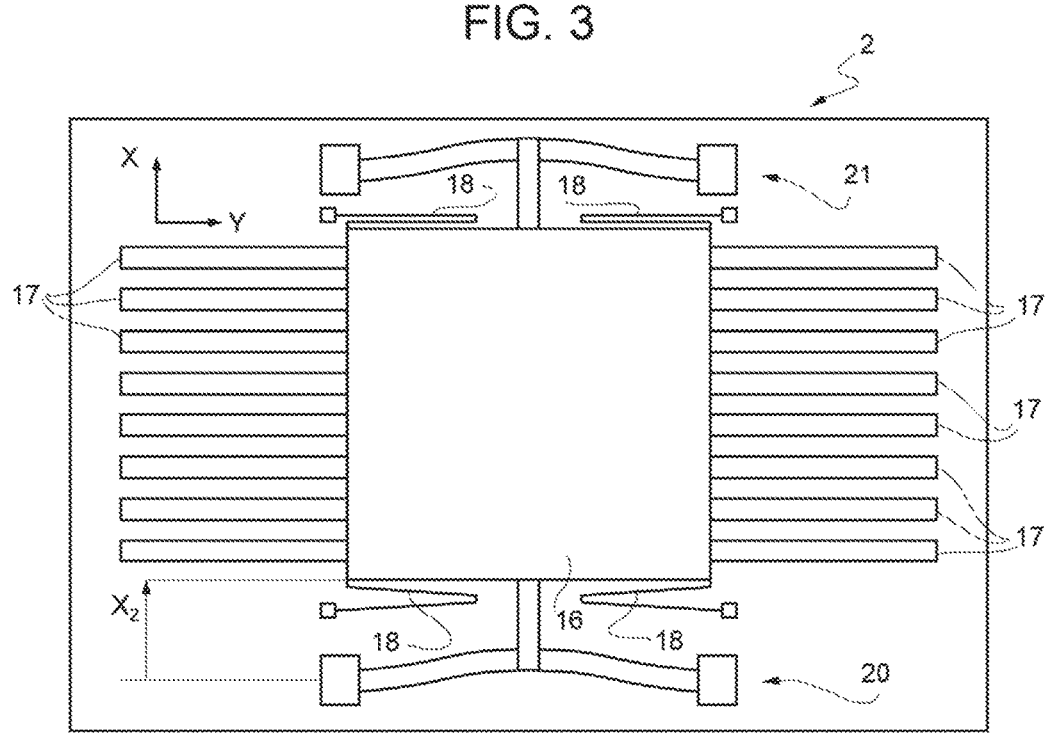
FIG. 3 shows the piezoelectric converter of FIG. 2 in a second operative configuration.

According to one embodiment of the disclosure, illustrated in FIGS. 2 and 3, the piezoelectric converter 2 comprises a microstructure including a supporting body 15, a movable mass 16, and a plurality of cantilever piezoelectric transducers 17. The supporting body 15, the movable mass 16, and part of the cantilever piezoelectric transducers 17 are of semiconductor material, for example monocrystalline silicon.

The supporting body 15 may be a semiconductor monolithic body, or else may be obtained by bonding two or more semiconductor chips, possibly with interposition of bonding layers and/or dielectric layers.

The movable mass 16 is elastically connected to the supporting body 15 by a system of suspensions 18, configured to enable displacements of the movable mass 16 according to an axis, generally an axis of translation or an axis of rotation. In the example described, in particular, the movable mass 16 may translate along an axis X between a first position $X_1$ (FIG. 2) and a second position $X_2$ (FIG. 3). The movable mass 16 may comprise, in addition to semiconductor structures, also layers or portions of heavy metals, such as lead or tungsten, in order to improve the energy-harvesting efficiency.

A first bistable mechanism 20 and a second bistable mechanism 21 are connected to opposite sides of the movable mass 16 with respect to the axis X and are configured to enable movement of the movable mass 16 from the first position $X_1$ to the second position $X_2$, or vice versa from the second position $X_2$ to the first position $X_1$, selectively when a force directed along the axis X and higher than a trigger threshold is applied to the movable mass 16. In one embodiment, the first bistable mechanism 20 and the second bistable mechanism 21 are coupled to opposite sides of the mass 16 with respect to the axis X.

The first bistable mechanism 20 and the second bistable mechanism 21 have respective first stable configurations (FIG. 2), when the movable mass 16 is in the first position $X_1$, and respective second stable configurations (FIG. 3), when the movable mass 16 is in the second position $X_2$. The first stable configurations and the second stable configurations correspond to respective configurations of minimum of potential energy of the first bistable mechanism 20 and of the second bistable mechanism 21. When the movable mass 16 is subjected to forces of intensity lower than the trigger threshold, the first bistable mechanism 20 and the second bistable mechanism 21 may deform slightly and then return into the starting stable configuration after the force has been removed. When, instead, the force applied to the movable mass 16 exceeds the trigger threshold, the first bistable mechanism 20 and the second bistable mechanism 21 suddenly reach the stable configuration opposite to the starting stable configuration, even if the force is removed before the transition is completed. The energy stored by the bistable mechanisms 20, 21 in order for them to undergo deformation beyond a trigger configuration is thus released very rapidly and returned to the movable mass 16. In this way, the movable mass 16 receives a stress of an impulsive type, which covers a very wide frequency band. The trigger threshold may be used as parameter to define with sufficient accuracy the conditions for switching from the first stable configuration to the second stable configuration and vice versa.

Figure 4:
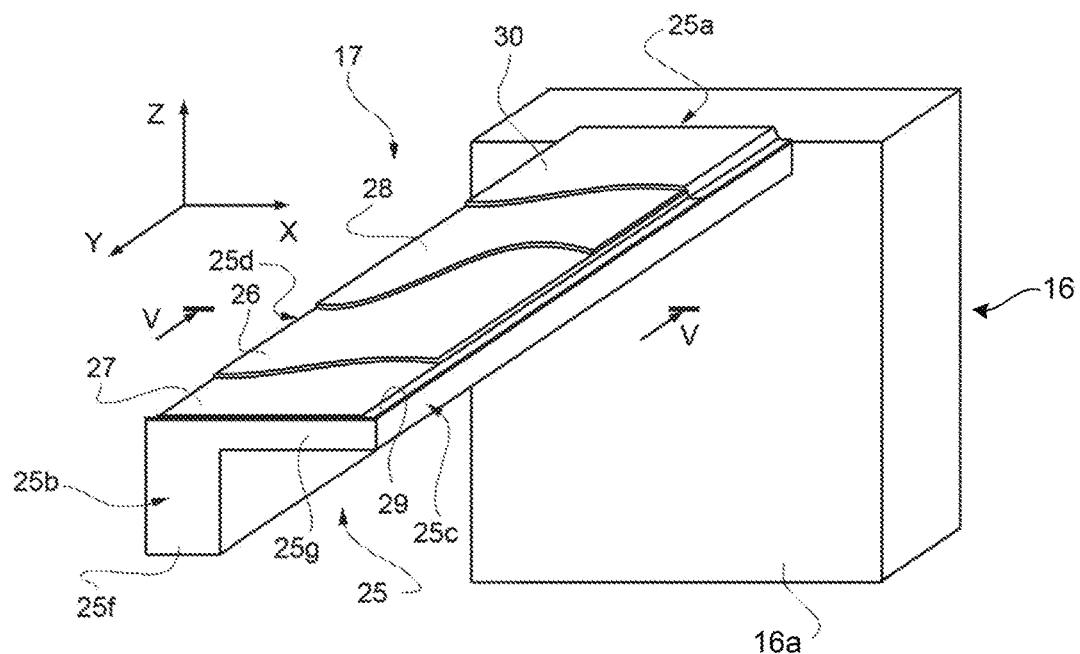
FIG. 4 is a perspective view from above of a piezoelectric transducer according to one embodiment of the present disclosure, integrated in the converter of FIG. 2.
Figure 5:
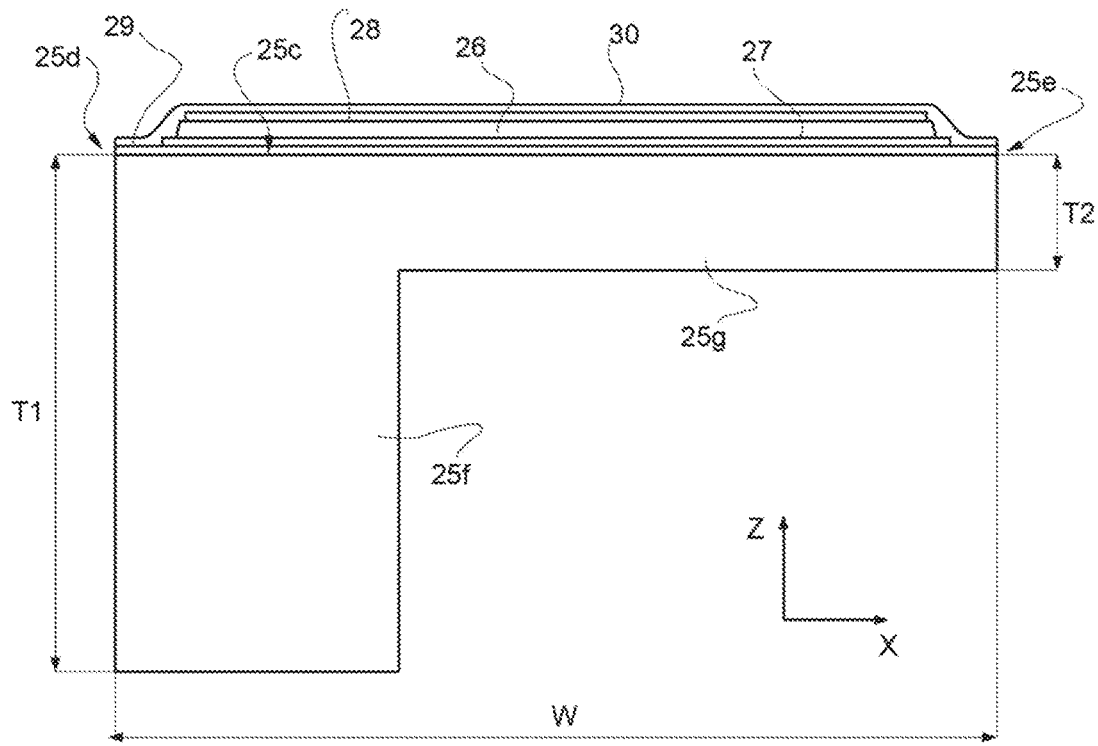
FIG. 5 is an enlarged cross-sectional view, taken in the line IV-IV of FIG. 2, of the piezoelectric transducer of FIG. 4.

With reference to FIGS. 4 and 5, each cantilever piezoelectric transducer 17 comprises a beam 25 of semiconductor material. The beam 25 extends in cantilever fashion from a respective anchorage portion 16a of the movable mass 16 in a main direction defined by an axis Y perpendicular to the axis X. The beam 25 is formed monolithically from the movable mass 16 and has a constrained end 25a, fixed to the anchorage portion 16a of the movable mass 16, and a free end 25b, opposite to the constrained end 25a.

The beam 25 has a face 25c parallel to a plane XY defined by the axis X and by the axis Y. The face 25c of the beam 25 has a main dimension along the axis Y and a secondary dimension along the axis X.

A piezoelectric layer 26 is arranged on at least one part of the face 25c of the beam 25. In one embodiment, the piezoelectric layer 26 may be of PZT (lead zirconate titanate). The piezoelectric layer 26 is arranged between a first electrode 27 and a second electrode 28. The first electrode 27, in turn, lies on the face 25c of the beam 25 and is electrically insulated therefrom by a dielectric layer 29, made, for example, of silicon oxide. The electrodes 27, 28 may be of metal material. The face 25c and the stack that includes the first electrode 27, the piezoelectric layer 26, and the second electrode 28 is coated by a passivation layer 30, made, for example, of silicon oxide.

The beam 25 is shaped so as to bend in response to mechanical stresses transmitted to the movable mass 16, in particular so as to cause a local harvesting voltage between the faces of the piezoelectric layer 26 in contact with the first electrode 27 and the second electrode 28. In practice, the deformations useful for setting up the local harvesting voltage include bending out of the plane XY defined by the axis X and by the axis Y.

The beam 25 is shaped so as to bend out of the plane XY also in response to in-plane forces parallel to the axis X. In detail, a cross-section of the beam 25 perpendicular to its main direction, i.e., perpendicular to the axis Y, is asymmetrical at least along a stretch of the beam 25. In one embodiment, the cross-section of the beam 25 is asymmetrical with respect to centroidal planes, in particular both to a centroidal plane parallel to the plane XY and to a centroidal plane parallel to a plane YZ, which is defined by the axis Y and by an axis Z perpendicular to the axis X and to the axis Y. In one embodiment, the beam 25 has a first thickness T1 along a first longitudinal edge 25d and a second thickness T2, smaller than the first thickness T1, along a second longitudinal edge 25e. In one embodiment, in addition, the first thickness T1 is smaller than a width W of the beam 25 (parallel to the axis X). For example, the cross-section of the beam 25 perpendicular to its main direction is L-shaped. A first longitudinal portion 25f of the beam 25 extends along the first longitudinal edge 25d and has the first thickness T1, and a second longitudinal portion 25g of the beam 25 extends along the second longitudinal edge 25e and has the second thickness T2. In one embodiment, the transition between the first longitudinal portion 25f and the second longitudinal portion 25g is defined by a wall 25h perpendicular to the axis X.

Figure 6:
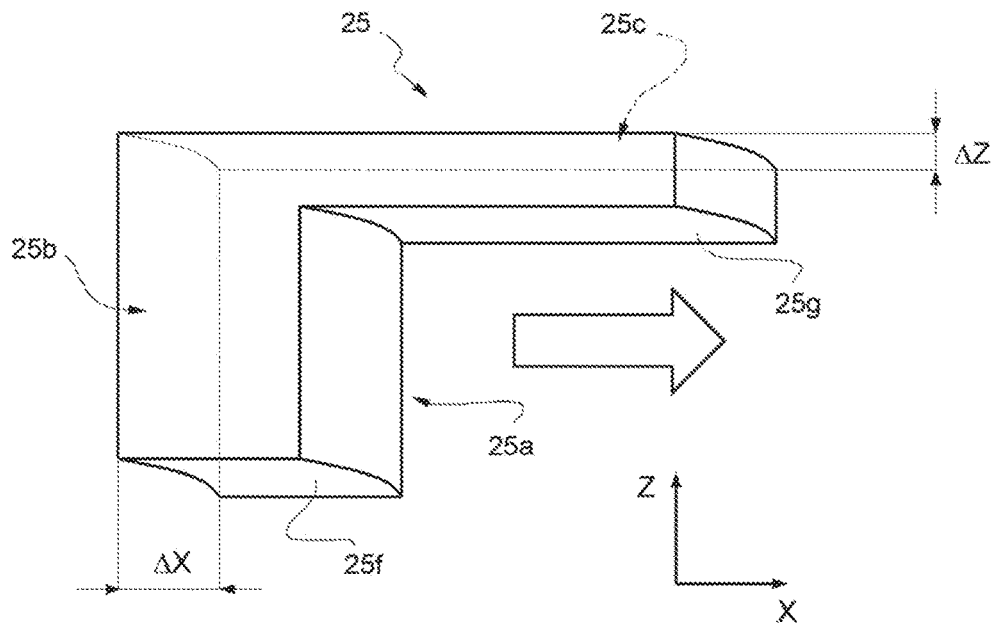
FIG. 6 is a front view of the piezoelectric transducer of FIG. 5 in a deformed configuration.
Figure 7:
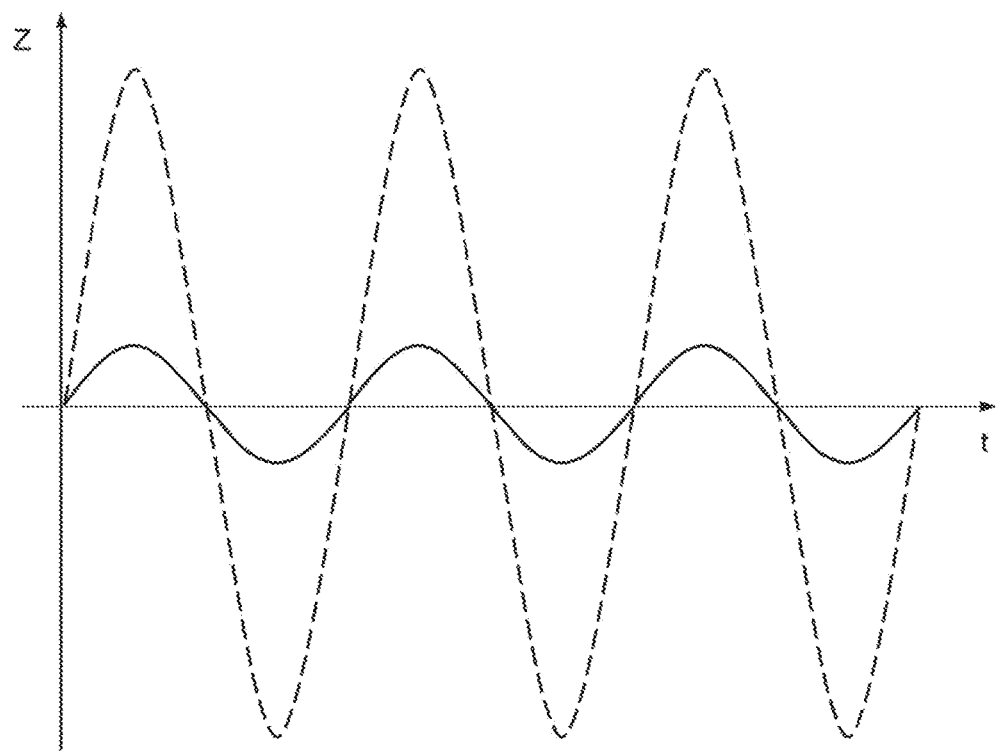
FIG. 7 is a graph that shows oscillations of the piezoelectric transducer of FIG. 5 in response to various mechanical stresses.
Figure 8:
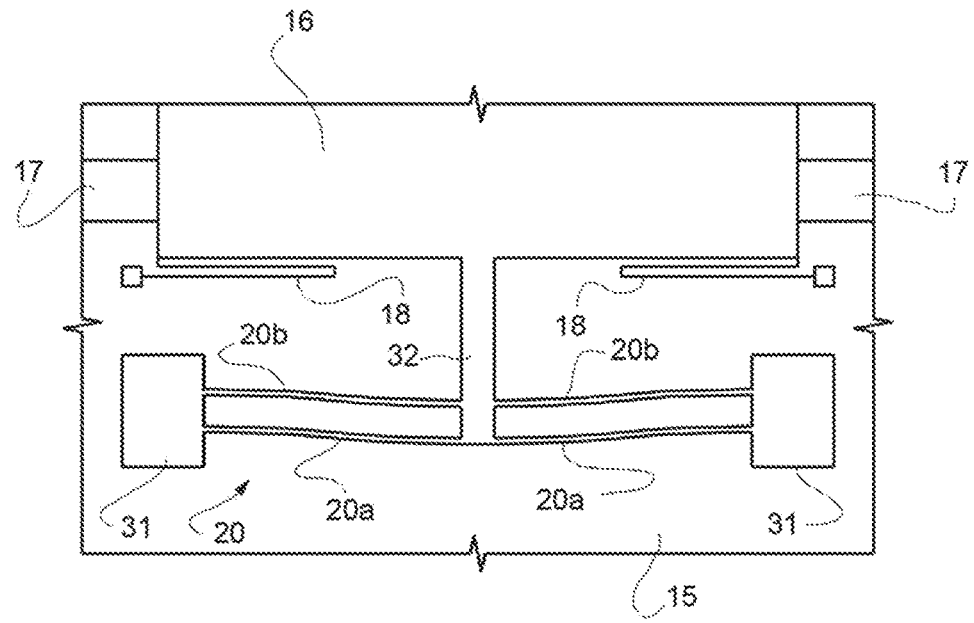
FIG. 8 is an enlarged top plan view of a detail of the converter of FIG. 2 in a first configuration.

The beam 25 undergoes deformation principally in response to forces that act in directions parallel to the axis Z (out-of-plane forces, in practice perpendicular to the plane XY). On account of the asymmetrical geometry, however, the beam 25 responds with deformations out of the plane XY also to forces oriented in directions parallel to the axis X. As shown in FIG. 6, a force acting along the axis X on the movable mass 16 produces a first component of deformation (in the plane XY) and, consequently, a first displacement ΔX of the free end 25b of the beam 25 with respect to the constrained end 25a. The first component of deformation does not contribute in itself to conversion of the mechanical energy into electrical energy because the piezoelectric layer 26 is not loaded for generating a local harvesting voltage between the first electrode 27 and the second electrode 28. The force acting along the axis X produces, however, also a second component of perpendicular to the plane XY and a consequent second displacement ΔY of the free end 25b of the beam 25 with respect to the constrained end 25a. This type of deformation is basically due to the asymmetry of the beam 25, in particular of the cross-section perpendicular to the axis Y. The stresses produced on the cross-section, in fact, are in turn asymmetrical and lead to deformation out of the plane XY. Unlike the first component of deformation, the second component of deformation contributes to generate electrical energy because loading of the piezoelectric layer 26 produces a local harvesting voltage between the first electrode 27 and the second electrode 28. The graph of FIG. 7 shows with a solid line the oscillations of the free end 25b of the beam 25 along the axis Z as a result of a force pulse parallel to the axis X. As may be noted, even though the oscillations have a smaller amplitude that the ones that derive from force pulses applied directly along the axis Z (dashed line), the contribution is, however, not negligible and significantly improves the overall efficiency of the piezoelectric converter 2.

Figure 9:
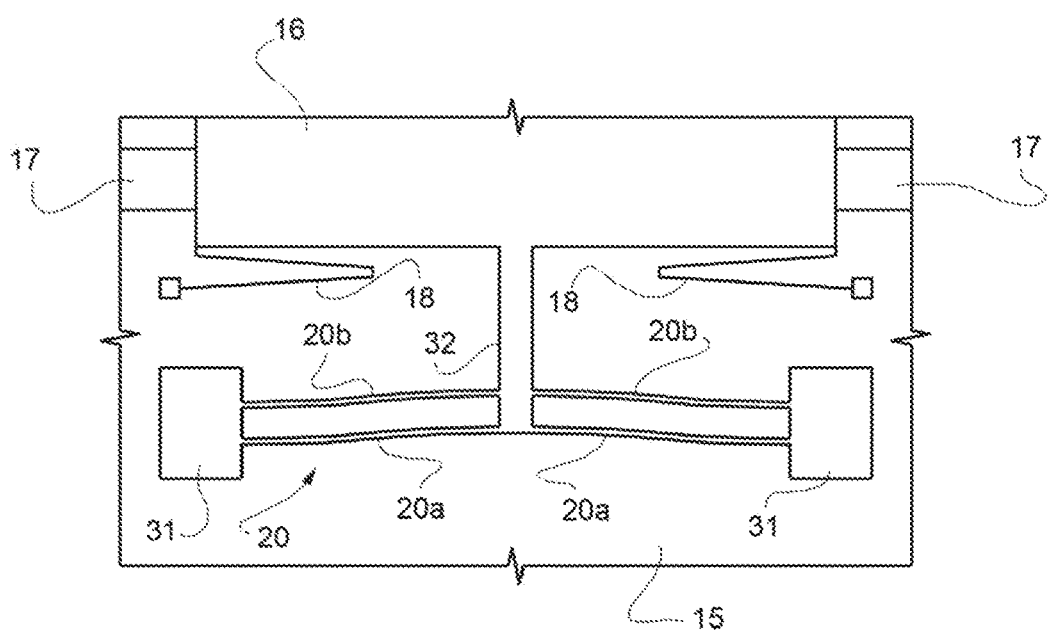
FIG. 9 is a top plan view of the detail of FIG. 8 in a second operative configuration.
Figure 10:
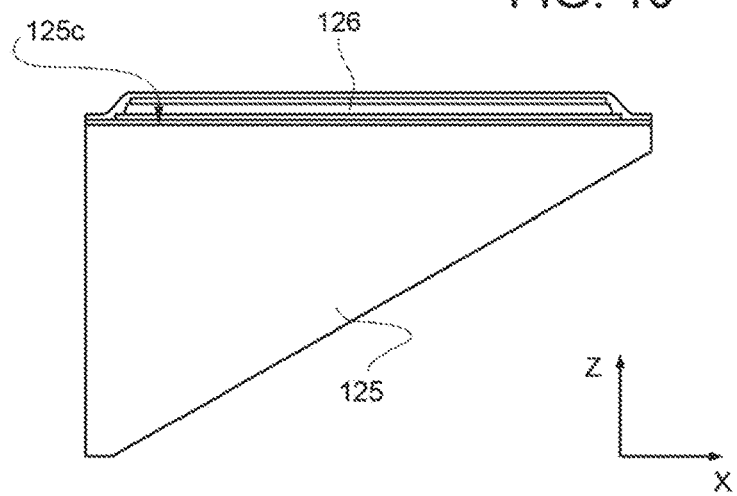
FIG. 10 is a cross-sectional view of a piezoelectric transducer according to a different embodiment of the present disclosure.

FIGS. 9 and 10 illustrate in greater detail the first bistable mechanism 20. What is described in what follows basically applies also to the second bistable mechanism 21, apart from the details that will be in any case described hereinafter.

The first bistable mechanism 20 comprises a system of linear elastic elements. In one embodiment, in particular, the first bistable mechanism 20 comprises a first elastic lamina element 20a and a second elastic lamina element 20b, which are defined by respective flexible plates of semiconductor material. Alternatively, the elastic lamina elements 20a, 20b may be of other materials, such as glass or metal. The first elastic lamina element 20a and the second elastic lamina element 20b have respective ends fixed to a surface of the supporting body 15 by anchorages 31 and for the rest are movable parallel to the plane XY between the first stable configuration and the second stable configuration. Furthermore, a bridge element 32 joins central portions of the first elastic lamina element 20a and of the second elastic lamina element 20b to the movable mass 16.

In the first stable configuration and in the second stable configuration, the first elastic lamina element 20a and the second elastic lamina element 20b have an arched shape, with a geometry selected according to the desired force threshold, and are parallel to one another. More specifically, in the first stable configuration, the first elastic lamina element 20a and the second elastic lamina element 20b define respective first concavities, open on the side facing the movable mass 16. In the second stable configuration, instead, the first elastic lamina element 20a and the second elastic lamina element 20b define respective second concavities, open on the side opposite to the movable mass 16.

Also the second bistable mechanism 21, not illustrated, comprises two elastic lamina elements fixed at the ends to the supporting body 15 and at the center to the movable mass 16 by a bridge element. The elastic lamina elements are arched with concavities open on the side opposite to the movable mass 16 in the first stable configuration and on the side facing the movable mass 16 in the second stable configuration.

As already mentioned previously, the transitions of the bistable mechanisms 20, 21 between the respective first stable configurations and the respective second stable configuration require applying a force that has an intensity higher than a trigger threshold and is oriented along the axis X. When these conditions arise, transition of the bistable mechanisms 20, 21 is very fast and causes the force to be transmitted to the movable mass 16 in an impulsive way. The cantilever piezoelectric transducers 17, in addition to responding also to in-plane forces directed along the axis X, are excited over a wide frequency band, which also comprises the mechanical resonance frequency of the cantilever piezoelectric transducers 17 themselves. In practice, the transitions of the bistable mechanisms 20, 21 enable translation to relatively high frequencies of the effects of those mechanical stresses that normally arise at a low frequency, frequently a few Hertz, but constitute an important environmental energy-harvesting source. Sources of this type are very useful especially for portable and wearable devices because they frequently derive from movements of the user, such as walking, and are thus always available. The frequencies naturally affected by human movement are, however, lower than the natural resonance frequencies of the cantilever piezoelectric transducers 17. In the absence of a frequency-translation mechanism, the response of the cantilever piezoelectric transducers 17 would be attenuated or even negligible. Thanks to the bistable mechanisms 20, 21, instead, the conversion of energy due to forces in the plane parallel to the axis X is carried out also in an efficient way, and a wider range of sources of mechanical stresses may be exploited.

Figure 11:
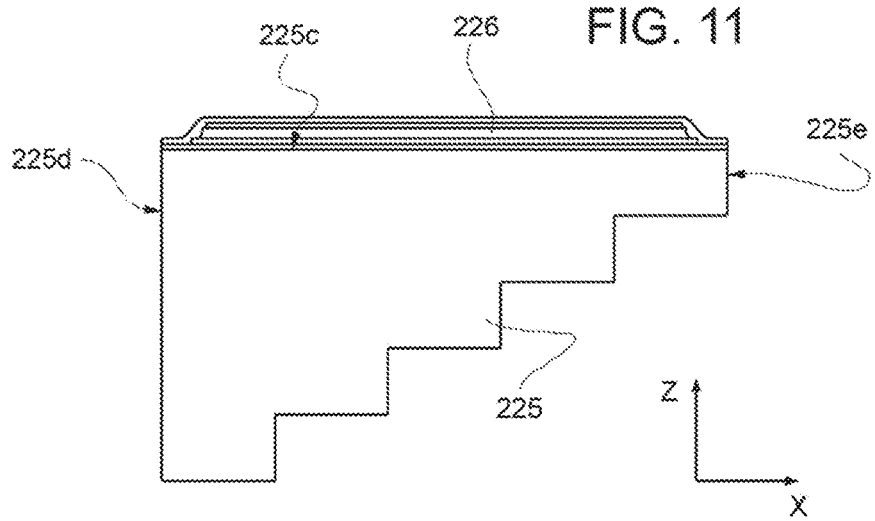
FIG. 11 is a cross-sectional view of a piezoelectric transducer according to another embodiment of the present disclosure.
Figure 12:
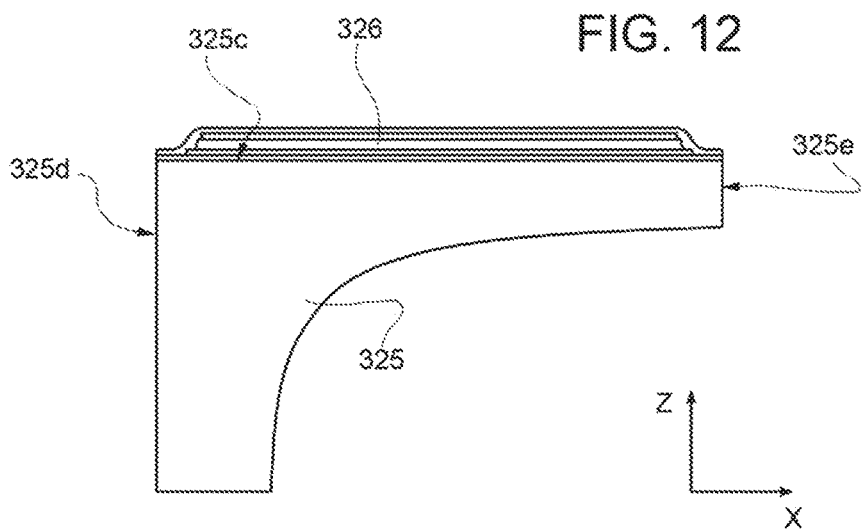
FIG. 12 is a cross-sectional view of a piezoelectric transducer according to a further different embodiment of the present disclosure.

FIGS. 10-12 show different embodiments of the disclosure, in which the cross-section of the beams has different profiles, once again asymmetrical.

In the example of FIG. 10, the cross-section of a beam 125 is substantially triangular. A piezoelectric layer 126 is located on a plane face 125c parallel to the plane XY.

In the example of FIG. 11, a piezoelectric layer 226 is located on a face 225c of a plane beam 225 parallel to the plane XY. A face opposite to the face 225c is staircase shaped and has a profile that degrades from a longitudinal edge 225d, where the thickness of the beam 225 is greater, to a second longitudinal edge 225e, where the thickness of the beam 225 is smaller.

In the example of FIG. 12, a beam 325 carries a piezoelectric layer 326 on one face 325c. An opposite face of the beam 325 has an arched profile degrading from a longitudinal edge 325d, where the thickness of the beam 325 is greater, to a second longitudinal edge 325e, where the thickness of the beam 325 is smaller.

Figure 13:
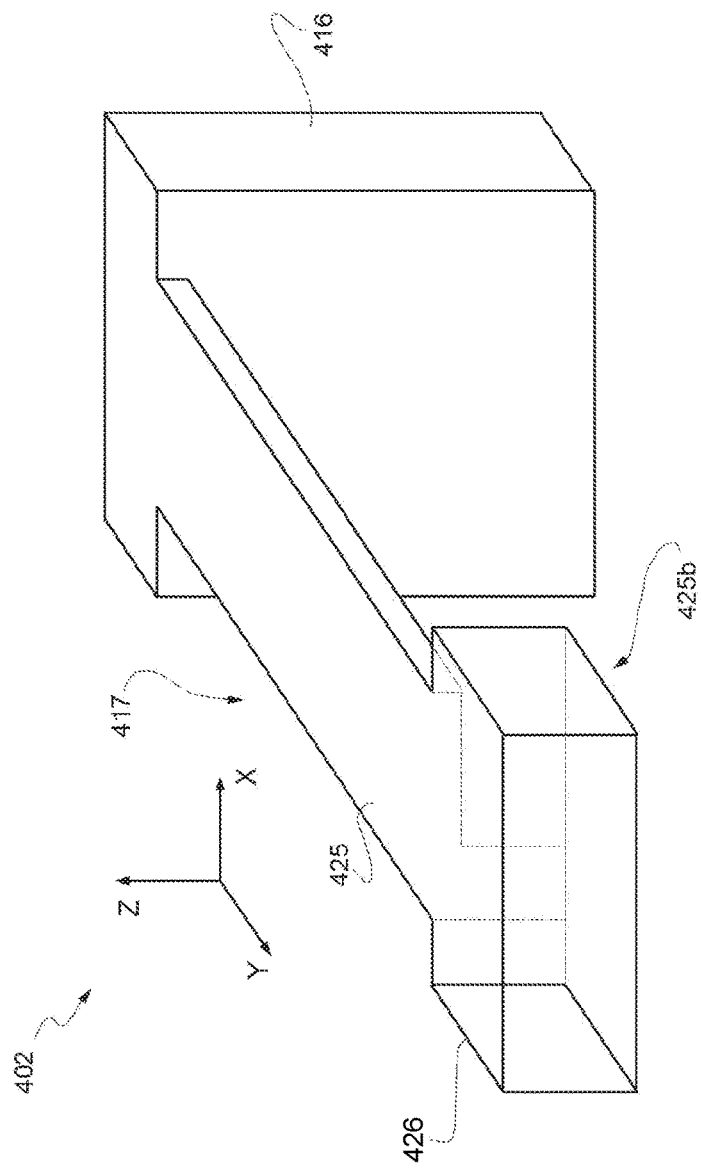
FIG. 13 is a perspective view from above of a piezoelectric transducer according to a further embodiment of the present disclosure.

FIG. 13 illustrates a detail of a piezoelectric converter 402, including a cantilever piezoelectric transducer 417. The cantilever piezoelectric transducer 417 comprises a beam 425 that extends in cantilever fashion from a supporting body, for example a movable mass 416 elastically constrained to a substrate (not illustrated). In a direction transverse to its own major dimension, the beam 425 has an asymmetrical cross-section, for example L-shaped. A weight 426 is fixed to a free end 425b of the beam 425. In one embodiment, the weight 426 is defined by a mass of semiconductor material of a single piece with the beam 425 and having a thickness equal to the maximum thickness of the beam 425 itself. The design of the weight 426, which may be easily controlled in the production stage, enables precise definition of the resonance frequency of the cantilever piezoelectric transducer 417.

Finally, it is evident that modifications and variations may be made to the piezoelectric transducer described herein, without thereby departing from the scope of the present disclosure, as defined in the annexed claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric transducer comprising:
an anchorage;
a cantilever beam of semiconductor material extending from the anchorage in a main direction parallel to a first axis and having a face parallel to a first plane defined by the first axis and by a second axis perpendicular to the first axis;
a piezoelectric layer on the face of the cantilever beam; and
a cross-section of the beam perpendicular to the first axis being asymmetrical and configured to cause the beam to deform out of the first plane in response to forces applied to the anchorage and in response to forces parallel to the second axis.

2. The piezoelectric transducer according to claim 1, wherein the cross-section of the beam perpendicular to the first axis is asymmetrical with respect to centroidal planes.

3. The piezoelectric transducer according to claim 2, wherein the cross-section of the beam perpendicular to the first axis is asymmetrical with respect to a centroidal plane parallel to the first plane and to a centroidal plane parallel to a second plane, which is defined by the first axis and by a third axis perpendicular to the first axis and to the second axis.

4. The piezoelectric transducer according to claim 3, wherein the beam has a first thickness along a first longitudinal edge and a second thickness, smaller than the first thickness, along a second longitudinal edge.

5. The piezoelectric transducer according to claim 4, wherein a first longitudinal portion of the beam extends along the first longitudinal edge and has the first thickness; and a second longitudinal portion of the beam extends along the second longitudinal edge and has the second thickness.

6. The piezoelectric transducer according to claim 5, wherein the cross-section of the beam perpendicular to the first axis is L-shaped.

7. The piezoelectric transducer according to claim 6, wherein the piezoelectric layer is arranged between a first electrode, which lies on the face of the beam, and a second electrode.

8. The piezoelectric transducer according to claim 7, comprising a weight at one end of the beam.

9. A piezoelectric converter, comprising:
a supporting body of semiconductor material;

a mass of semiconductor material, movable with respect to the supporting body; and a plurality of piezoelectric transducers, each of the plurality of piezoelectric transducers including, an anchorage;

a beam of semiconductor material, cantilever extending from the anchorage in a main direction parallel to a first axis and having a face parallel to a first plane defined by the first axis and by a second axis perpendicular to the first axis;

a piezoelectric layer on the face of the beam; and a cross-section of the beam perpendicular to the first axis being asymmetrical and shaped so that the beam presents deformations out of the first plane in response to forces applied to the anchorage and directed according to the second axis.

10. The piezoelectric converter according to claim 9, wherein the mass is elastically constrained to the supporting body and is movable with respect to the supporting body along the second axis between a first position and a second position.

11. The piezoelectric converter according to claim 10, comprising a bistable device coupled to the mass and configured to enable movement of the mass between the first position and the second position in response selectively to forces that are oriented along the second axis and have an intensity higher than a trigger threshold.

12. The piezoelectric converter according to claim 11, wherein the bistable device has a first stable configuration when the mass is in the first position and a second stable configuration when the mass is in the second position and is connected to the mass so that forces applied to the mass and oriented along the second axis tend to deform the bistable device.

13. The piezoelectric converter according to claim 12, wherein the bistable device comprises a first bistable mechanism, which includes a first elastic lamina element and a second elastic lamina element, which have respective ends fixed to the supporting body, and a bridge element, which connects central portions of the first elastic lamina element and of the second elastic lamina element to the mass.

14. The piezoelectric converter according to claim 13, wherein the first elastic lamina element and the second elastic lamina element are arched and parallel to one another in the first stable configuration and in the second stable configuration and are movable parallel to the first plane between the first stable configuration and the second stable configuration.

15. The piezoelectric converter according to claim 14, wherein the first elastic lamina element and the second elastic lamina element define, in the first stable configuration, respective first concavities open on the side facing the mass and, in the second stable configuration, respective second concavities open on the side opposite to the mass.

16. The piezoelectric converter according to claim 15, wherein the bistable device comprises a second bistable mechanism, substantially the same as the first bistable mechanism, the first bistable mechanism and the second bistable mechanism being coupled to opposite sides of the mass with respect to the second axis.

17. The piezoelectric converter according to claim 16, wherein a first elastic lamina element and a second elastic lamina element of the second bistable mechanism define, in the first stable configuration, respective first concavities open on the side opposite to the mass and, in the second stable configuration, respective second concavities open on the side facing the mass.

18. An energy-harvesting system, comprising:

a piezoelectric converter configured to harvest environmental energy and to convert the environmental energy harvested into an electrical harvesting signal the piezoelectric converter including, a supporting body of semiconductor material;

a mass of semiconductor material, movable with respect to the supporting body;

a plurality of piezoelectric transducers, each of the plurality of piezoelectric transducers including, an anchorage;

a beam of semiconductor material, cantilever extending from the anchorage in a main direction parallel to a first axis and having a face parallel to a first plane defined by the first axis and by a second axis perpendicular to the first axis;

a piezoelectric layer on the face of the beam; and a cross-section of the beam perpendicular to the first axis being asymmetrical and shaped to deform the beam out of the first plane in response to forces applied to the anchorage and directed according to the second axis;

a storage element configured to store electrical energy deriving from conversion of the environmental energy harvested by the piezoelectric converter; and a harvesting interface coupled to the piezoelectric converter and configured to supply an electrical charging signal to the storage element as a function of the electrical harvesting signal.

19. The energy-harvesting system of claim 18 further comprising a load coupled to the storage element.

20. The energy-harvesting system of claim 19, wherein the load comprises at least one of cellphone circuitry, tablet computer circuitry, laptop computer circuitry, video camera circuitry, digital camera circuitry, and videogame console circuitry.

* * * * *